(12) United States Patent
Inami et al.

(10) Patent No.: US 9,145,620 B2
(45) Date of Patent: Sep. 29, 2015

(54) SINGLE CRYSTAL PULLING APPARATUS

(75) Inventors: Shuichi Inami, Tokyo (JP); Ken Hamada, Tokyo (JP); Hiroaki Taguchi, Tokyo (JP); Takuya Yotsui, Tokyo (JP); Takashi Atami, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1552 days.

(21) Appl. No.: 12/385,384

(22) Filed: Apr. 7, 2009

(65) Prior Publication Data

US 2009/0249998 A1 Oct. 8, 2009

(30) Foreign Application Priority Data

Apr. 8, 2008 (JP) .................................. 2008-100272

(51) Int. Cl.
*C30B 15/20* (2006.01)
*C30B 15/14* (2006.01)
*C30B 15/10* (2006.01)
*C30B 35/00* (2006.01)

(52) U.S. Cl.
CPC .................. *C30B 15/14* (2013.01); *C30B 15/10* (2013.01); *C30B 15/20* (2013.01); *C30B 15/206* (2013.01); *C30B 35/00* (2013.01); *Y10T 117/1068* (2015.01)

(58) Field of Classification Search
CPC ........ C30B 15/00; C30B 15/14; C30B 15/20; C30B 15/206; C30B 35/00; Y10T 117/1068
USPC ...................... 117/200, 217, 222, 13, 34, 206
See application file for complete search history.

(56) References Cited

U.S. PATENT DOCUMENTS

| 5,316,742 | A  | * | 5/1994  | Tomioka et al. ............... 117/217 |
| 6,036,776 | A  | * | 3/2000  | Kotooka et al. ............... 117/217 |
| 6,117,402 | A  | * | 9/2000  | Kotooka et al. ............ 422/245.1 |
| 2003/0051661 | A1 | * | 3/2003 | Kubo et al. .................... 117/217 |
| 2003/0154907 | A1 | * | 8/2003 | Inagaki et al. .................. 117/19 |
| 2003/0183163 | A1 | * | 10/2003 | Kubo et al. .................... 117/213 |
| 2005/0268840 | A1 | * | 12/2005 | Inagaki et al. .................. 117/13 |

FOREIGN PATENT DOCUMENTS

| JP | 2002-121096 | 4/2002 |
| JP |     3678129 | 5/2005 |
| JP | 2005-145764 | 6/2005 |

* cited by examiner

*Primary Examiner* — Matthew Song
(74) *Attorney, Agent, or Firm* — Clark & Brody

(57) ABSTRACT

A single crystal pulling apparatus comprises: a chamber; a crucible disposed within the chamber for containing a melt; a water-cooling means disposed within the chamber in such a manner as surrounding a single crystal pulled up from the melt in the crucible; water piping for feeding cooling water to and discharging the same from the water-cooling means; and supporting arms connected to the chamber for supporting the water-cooling means, wherein the supporting arms are disposed between the single crystal and the water piping. According to this configuration, the supporting arms can prevent the water piping from being damaged in the event of fall and collapse of the single crystal due to failure of the seed neck portion or in the event of rupture of the single crystal due to thermal stress, for instance.

11 Claims, 3 Drawing Sheets

SINGLE CRYSTAL PULLING APPARATUS

BACKGROUND OF THE INVENTION

1. Field of the Invention

This invention relates to a single crystal pulling apparatus comprising a water-cooling means for cooling the single crystal while it is pulled and, more particularly, to a single crystal pulling apparatus capable of circumventing adverse effects caused by the provision of a water-cooling means, for example, failures of water piping for supplying cooling water to and discharging the same from the water-cooling means.

2. Description of the Related Art

Various methods are available for the production of silicon single crystals for use in semiconductor substrates and, among them, crystal pulling with simultaneous rotation based on the Czochralski method (hereinafter referred to as "CZ method") is now widely employed.

According to the CZ method, within a chamber of a single crystal pulling apparatus, a seed crystal held at the lower end of a pull shaft is immersed into silicon melt in a quartz crucible and the pull shaft is pulled up while the crucible and the pull shaft are rotated, thereby a silicon single crystal is grown below the seed crystal.

Usually, a method for increasing the diameter of the single crystal or/and a method for increasing a pull rate of the single crystal are generally employed to improve the single crystal production efficiency. Among these, a method for increasing the single crystal pull rate comprises disposing a heat-shielding member around the single crystal which is being pulled up from the silicon melt, so that the radiant heat emitted from the melt in the crucible and from a heater disposed outside the crucible is shut off by the heat-shielding member and the cooling of the single crystal may be promoted accordingly. A method of further promoting the cooling of the single crystal, proposed in Japanese Patent No. 3678129 and Japanese Patent Application Publication No. 2002-121096 comprises disposing a water-cooling means, which is cooled with cooling water inside a heat-shielding member, in such a manner as surrounding the single crystal in a single crystal pulling apparatus equipped with the heat-shielding member.

Japanese Patent Application Publication No. 2005-145764 proposes a cooling device in which a water-cooling means and water piping for supplying cooling water to this water-cooling means and discharging the same therefrom are made of a similar metal, for example copper or stainless steel. Copper is a nonmagnetic material and is high in thermal conductivity, while stainless steel is high in mechanical strength and, in particular, austenitic stainless steel is advantageous in that, in the case of pulling under application of a magnetic field, it is not affected by the magnetic field.

SUMMARY OF THE INVENTION (1) In the case of pulling a single crystal by the CZ method, it is required that dislocations remaining in a seed crystal and/or dislocations caused by thermal shock upon contact of the seed crystal with the melt will not be extended to the cylindrical part of the single crystal which yields products. Therefore, for excluding dislocations from the single crystal to produce the disclocation-free single crystal, seed necking is performed, namely the diameter of the crystal initially grown after immersion of the seed crystal into the melt is narrowed down to about 5 mm.

On the occasion of the seed necking, the pulling rate and the melt temperature are controlled so that the desired seed neck portion may be formed. A seed neck portion having a smaller diameter can be formed by increasing the pulling rate or increasing the temperature of the melt and, conversely, a seed neck portion having a larger diameter can be formed by lowering the pulling rate or lowering the melt temperature.

If, however, the diameter of the seed neck portion is excessively narrowed in seed necking, the seed neck portion may happen to become unable to bear the weight load of the suspended single crystal, which increases with growth of the crystal, with a result that the seed neck portion is broken and the single crystal falls off. On the other hand, in the case of the pulling with the increased cooling rate of single crystal along with the increased pulling rate thereof, that is, under the condition of high thermal stress, abnormally high pulling rate due to some trouble in controlling the pulling rate imposes excessive thermal stress on the single crystal. As a result, the single crystal may rupture, and broken pieces of the single crystal may be strewn within the chamber.

Because water piping is provided without protection within the chamber according to the methods proposed in Japanese Patent No. 3678129 and Japanese Patent Application Publication No. 2002-121096, on the occasion of such troubles mentioned above, a falling single crystal or strewn pieces of the ruptured single crystal collide with the water piping to break or damage the water piping.

(2) When the water-cooling means and the water piping are made of similar metals, as proposed in Japanese Patent Application Publication No. 2005-145764, the following problems may be encountered. When the water-cooling means and the water piping are made of copper, for instance, its cost is high and its strength comes up short as compared with the case of stainless steel. If the water-cooling means and the water piping are made of stainless steel, cooling performance is poor since stainless steel is inferior in thermal conductivity to copper. Therefore, it is preferred that the water-cooling means be made of copper for improved cooling performance and the water piping be made of stainless steel which is inexpensive and has sufficient strength and corrosion resistance.

When, however, the water-cooling means is made of copper while the water piping is made of stainless steel, dissimilar metals are jointed at the joint between the water-cooling means and the water piping, and further the joint is in contact with cooling water to thereby be exposed to an electrically conductive environment. The joint of dissimilar metals exposed to an electrically conductive environment may form an electric circuit to generate local corrosion. It is thus feared that the local corrosion at the joint between the water-cooling means and the water piping might result in leakage of cooling water, leading up to vapor explosion within the chamber.

(3) The water-cooling means is generally designed so that the temperature of the water passing through the inside thereof is sufficiently lower than the boiling point of water. In cases where a dissolved gas content in cooling water is high, however, bubbles may be formed in the cooling water. If the bubbles thus-formed are retained in water channel, the thermal conductivity of the portions where the bubbles are retained will deteriorate.

A condition so-called positive feedback may possibly be created; namely, portions reduced in thermal conductivity are not cooled well enough, the temperature of those portions is raised by the radiant heat from the single crystal, and more bubbles are formed to further lower the thermal conductivity, and the temperature further rises accordingly. Once the condition of positive feedback has been created, the water-cooling means is heated and cooling water in the water-cooling means boils, whereby the water-cooling means and/or the joint between the water-cooling means and the water piping may possibly be fractured.

The present invention is made in view of the problems mentioned above. It is an object of the present invention to provide a single crystal pulling apparatus comprising a water-cooling means for cooling a silicon single crystal; and water piping for supplying cooling water to and discharging the same from the water-cooling means, and the apparatus being able to prevent damages of the water piping attributable to the single crystal during pulling. A further object of the present invention is to provide a single crystal pulling apparatus which can prevent occurrence of vapor explosion within the chamber in the case of water leakage which results from local corrosion at the joint of dissimilar metals in the water piping, and the apparatus further preventing damages of the water-cooling means which results from boiling of cooling water in the water-cooling means.

The present inventors, after incessant investigations on configuration of the single crystal pulling apparatus to accomplish the above objects, found that supporting arms for supporting the water-cooling means of a cooling device inside the chamber can be simultaneously used as protective members for protecting the water piping against the accidental fall or rupture of the single crystal during pulling.

The present inventors further found that it is effective to use copper for the water piping segment to be jointed to the water-cooling means because of excellent thermal conductivity and to use stainless steel for other piping segment because it is less expensive and superior in corrosion resistance and strength. Further the present inventors found that if local corrosion should occur at the joint of dissimilar metals in this case, an emergency can be avoided by disposing the joint outside the chamber.

Furthermore, because of low temperature of the unheated cooling water in the region of the cooling water inflow in the water-cooling means, there is less likelihood of generation of bubbles, and if any, the generated bubbles are readily carried away by a horizontal or upward stream of water. Therefore, the present inventors found that the bubbles are easily discharged to the outside of the water-cooling means by providing with the downward water flow only in the region of the cooling water inflow in the water-cooling means, followed by gradually directing the water flow upwards.

The present invention has been completed based on the above-mentioned investigation results, and the gist of the present invention is a single crystal pulling apparatus as defined below.

The single crystal pulling apparatus according to the present invention comprises a chamber; a crucible disposed within the chamber for containing a melt; a water-cooling means disposed within the chamber in such a manner as surrounding a single crystal pulled up from the melt in the crucible; water piping for supplying cooling water to and discharging the same from said water-cooling means; and supporting arms connected to the chamber for supporting the water-cooling means, the supporting arms being disposed between the single crystal and said water piping.

In the single crystal pulling apparatus mentioned above, the supporting arms are preferably formed using shape steels (e.g. channel steels, angle steels) from viewpoints of workability on the occasion of installation of the supporting arms and protection of the water piping, and stainless steel (e.g. austenitic stainless steel) is preferably employed as material for the supporting arms from viewpoints of strength and corrosion resistance.

Further, in the above single crystal pulling apparatus, it is preferable that the water piping is extended to the outside of the chamber, and the water piping is configured to comprise a first segment as being connected to the water-cooling means and made of a first material similar to the material that is used for the water-cooling means, and a second segment that is made of a second material different from the material that is used for the water-cooling means, and the first and second segments made of the first and second material, respectively, are jointed to each other outside the chamber.

This is because there is a risk of water leakage from local corrosion resulting from the formation of an electric circuit between dissimilar metals in association with the cooling water that creates an electrically conductive environment at the joint of dissimilar metals in the water piping, and the water leakage within the chamber leads to vapor explosion.

Here, for improving the cooling performance of the water-cooling means, copper (e.g. oxygen-free copper) high in thermal conductivity is preferably used as the first material and stainless steel (e.g. austenitic stainless steel) is preferably used as the second material to make the water piping outside the chamber inexpensive and high in strength and in corrosion resistance.

And, it is preferable that the water channel disposed within the water-cooling means is configured so as to lead the cooling water supplied from the water piping downward to the bottom of the water-cooling means and then lead the cooling water gradually upward with circulation flow for discharging the cooling water. This is because, even when bubbles are generated in the water channel, the bubbles can be promptly discharged out of the water-cooling means.

In the single crystal pulling apparatus of the present invention, the supporting arms are disposed between the water piping and the single crystal within the chamber, so that, even in the event of fall and collapse of the single crystal due to the failure of the seed neck portion during pulling single crystal or in the event of rupture of the single crystal because of unbearable high thermal stress, the water piping can avoid damages to be caused by the single crystal.

Even when the water piping contains joints of dissimilar materials for improving the cooling performance of the water-cooling means and at the same time rendering the water piping inexpensive and high in strength and in corrosion resistance, such joints are not disposed inside the chamber, so that the occurrence of vapor explosion inside the chamber can be avoided.

Furthermore, even when bubbles generate in cooling water in the water channel inside the water-cooling means, the bubbles can be promptly discharged from the water-cooling means to the outside, so that the risk of the boiling of cooling water inside the water-cooling means due to bubbles can be reduced.

DETAILED DESCRIPTION OF THE PREFERRED EMBODIMENTS

Figure 1:
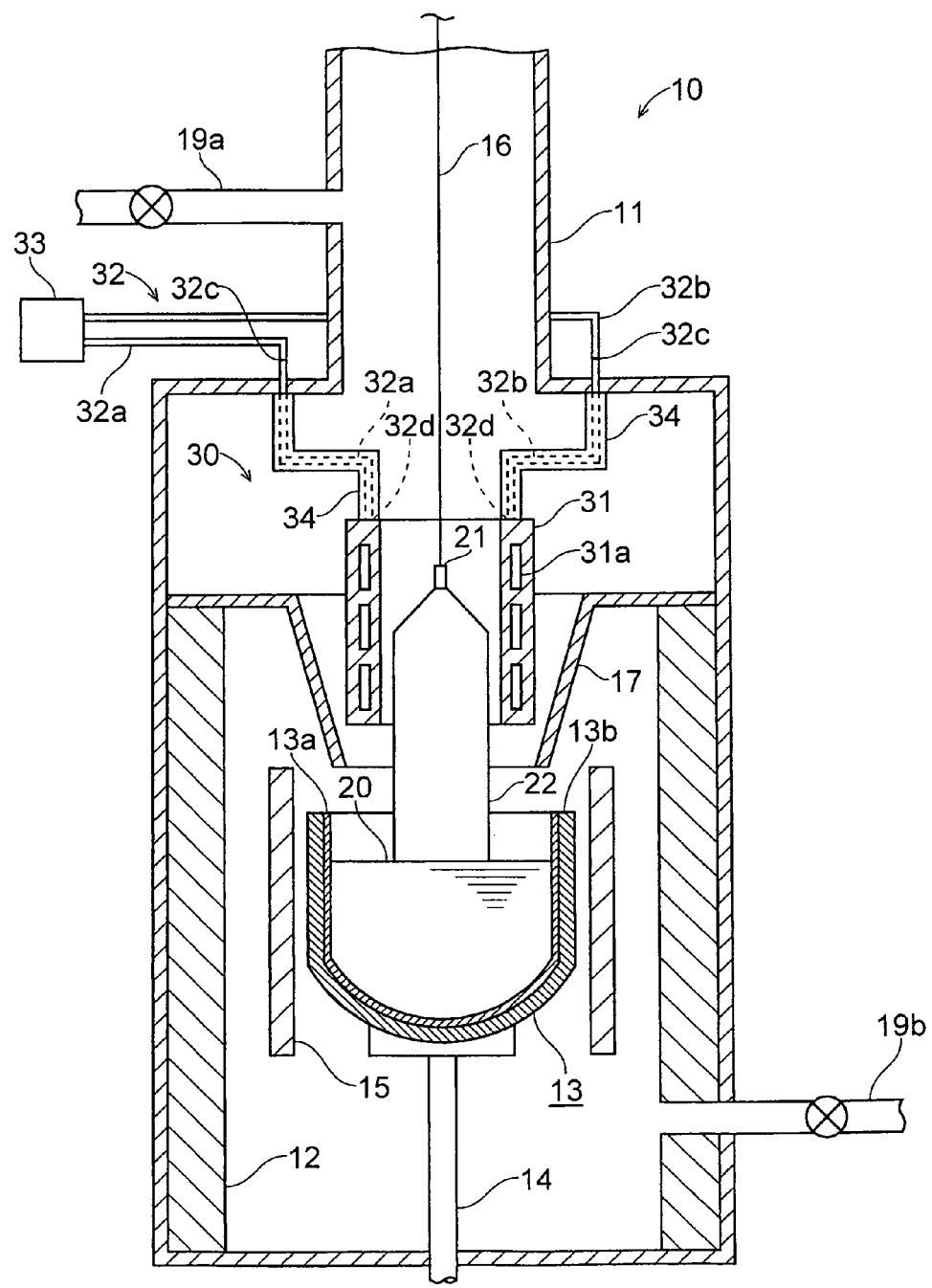
FIG. 1 is a schematic sectional view of a configuration example of a single crystal pulling apparatus of the present invention.

FIG. 1 is a schematic sectional view of a configuration example of a single crystal pulling apparatus of the present invention which is for use in pulling a silicon single crystal by the CZ method. In the single crystal pulling apparatus 10, a chamber 11 constitutes the exterior of the apparatus, and a thermal insulation member 12 is disposed on the inside surface of the chamber 11, and a crucible 13 is disposed in the central part of the chamber 11.

The crucible 13 has a double-layer structure having a quartz crucible 13a, which is an inner layer holding vessel made of quartz in the form of a bottomed cylinder, and a graphite crucible 13b, which is an outer layer holding vessel made of graphite and fitted to the outside of the quartz crucible 13a for holding the same.

The crucible 13 is fixedly mounted on the upper end of a supporting shaft 14 so that it can be rotated and caused to ascend or descend, and a resistance heating type heater 15 is disposed around the crucible 13. A silicon material fed into the crucible 13 is melted by the heater 15 to give a melt 20. The temperature of the melt 20 is adjusted to a level compatible with a seed crystal 21.

Above the crucible 13, there is disposed a pull shaft 16 rotating at a predetermined speed in the reverse direction or in the same direction as that of the supporting shaft 14 on the same axis. The seed crystal 21 is held at the lower end of the pull shaft 16. The seed crystal 21 is immersed into the melt 20 and the pull shaft 16 is hoisted while the crucible 13 and the pull shaft 16 are rotated, whereby a single crystal 22 can be grown.

An inverse truncated cone-shaped heat-shielding member 17 is disposed around the single crystal 22 which is being pulled up, for shielding the radiant heat from the surface of the melt 20 and from the heater 15. The heat-shielding member 17 is fixedly mounted at the upper end of the thermal insulation member 12. Inside the heat-shielding member 17, there is disposed a cylindrical water-cooling means 31, and the single crystal 22 during pulling passes through the interior space of the cooling means 31.

The water-cooling means 31 is provided, in the inside thereof, with water channel 31a for passing cooling water, and the cooling means 31 is cooled with the cooling water therein. A feed-water pipe 32a for feeding the cooing water and a waste pipe 32b for discharging the cooling water from the cooling means 31 are connected to the cooling means 31. The feed-water pipe 32a and the waste pipe 32b are connected to a cooling water feeding and discharging device 33 disposed outside the chamber 11. A cooling device 30 comprises the water-cooling means 31, the feed-water pipe 32a, the waste pipe 32b and the cooling water feeding and discharging device 33. In the following description, the feed-water pipe 32a and the waste pipe 32b are collectively referred to as "water piping 32".

The radiant heat from the surface of the melt 20 is blocked by the heat-shielding member 17 and the water-cooling means 31 and thereby the cooling of the single crystal 22 is promoted, so that the pulling rate of the single crystal 22 can be increased.

Copper, for example oxygen-free copper, excellent in thermal conductivity can be employed as material for the water-cooling means 31 for improving the performance of cooling the single crystal 22. Copper can be employed for the segment of water piping 32 to be jointed to the water-cooling means 31, which is made of copper, so as to avoid jointing dissimilar metals. While stainless steel which is inexpensive and has sufficient strength and corrosion resistance, for example, austenitic stainless steel, can be employed for the segment of the water piping 32 to be jointed to the cooling water feeding and discharging device 33. Joints 32c between the copper-made segments of the water piping 32 and the stainless steel-made segments thereof are disposed outside the chamber 11.

Figure 2:
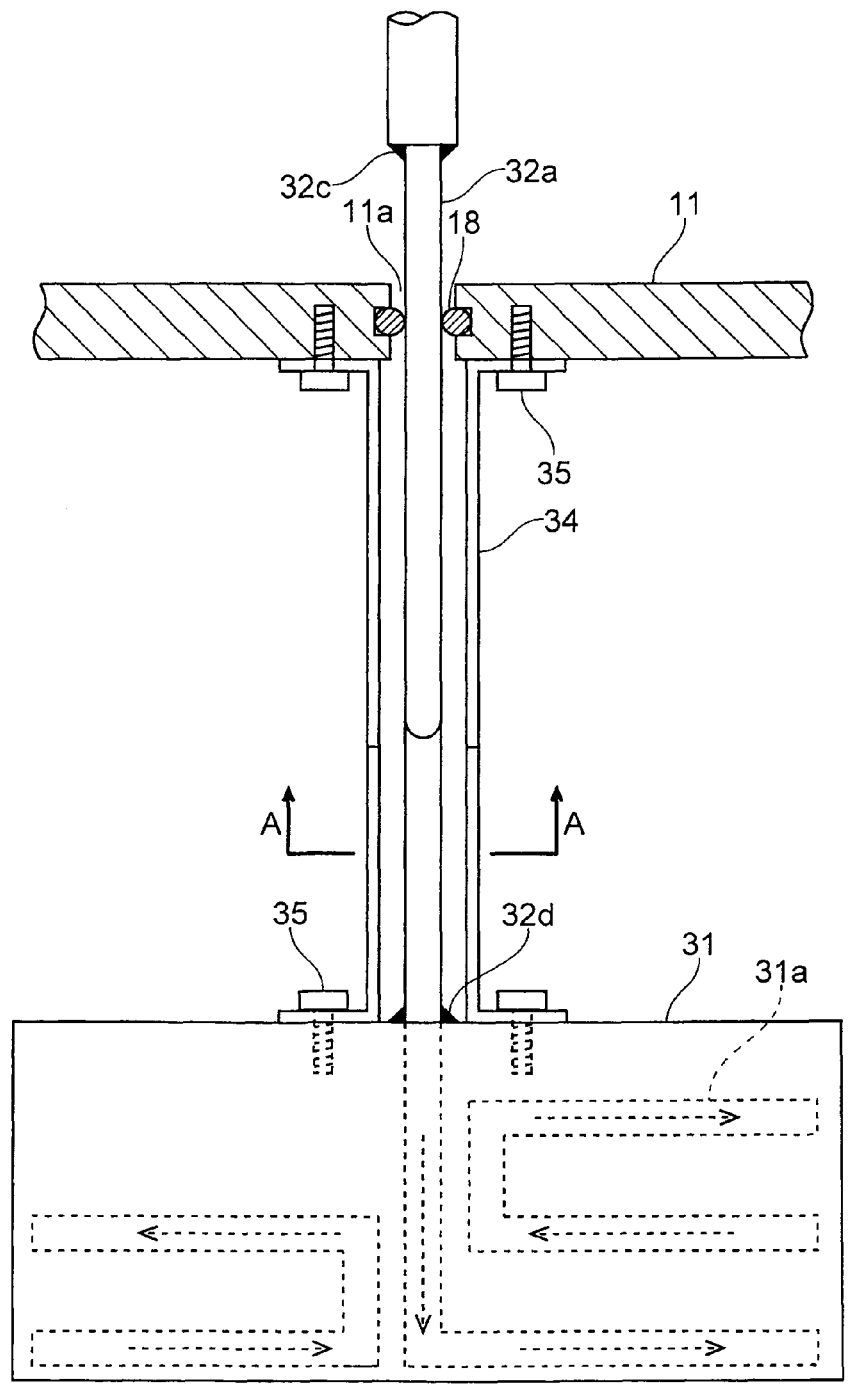
FIG. 2 is a partial enlarged view of the vicinity of a water-cooling means as seen from the lateral side.

FIG. 2 is a partial enlarged view of the vicinity of water-cooling means as seen from the lateral side. As shown in FIG. 2, the chamber 11 is provided with holes 11a for penetration of the water piping 32 (in FIG. 2, the feed-water pipe 32a is solely shown as a representative) and O rings 18 are disposed between the holes 11a and the pipes of water piping 32 for securing air-tightness for the inside of the chamber 11. The water-cooling means 31 is fixedly mounted onto the upper part of the chamber 11 by means of supporting arms 34 formed using shape steels as shown in FIGS. 1 and 2.

Figure 3A:
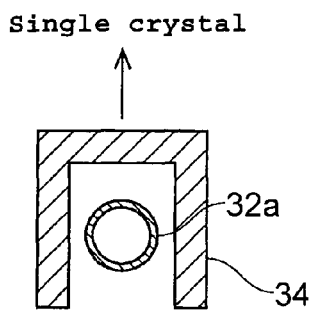
FIGS. 3A and 3B are sectional views along A-A in FIG. 2 for illustrating arrangements of supporting arm and water piping.
Figure 3B:
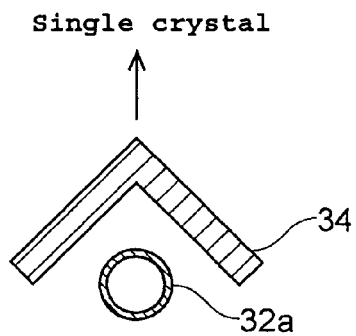

FIGS. 3A and 3B are sectional views along A-A in FIG. 2 for illustrating the arrangement of supporting arm and water piping. In FIGS. 3A and 3B, the position of the single crystal which is being pulled up is indicated by an arrow, and the feed-water pipe 32a is shown as a representative of the water piping 32. FIG. 3A shows the case in which the supporting arm 34 is formed using channel steels (so-called channel) while FIG. 3B shows the case in which the supporting arm 34 is formed using angle steels (so-called angle) The supporting arms 34 shown in FIGS. 3A and 3B each is disposed between the water piping 32 and the single crystal in a manner such that the arm covers the water piping 32 on the side facing the single crystal.

Stainless steel, for example austenitic stainless steel, can be used in making the supporting arms 34 from viewpoints of high-temperature strength and corrosion resistance. In the present embodiment, the supporting arms 34 are fixedly mounted onto the upper part of the chamber 11 and to the water-cooling means with bolts 35, as shown in FIG. 2. The supporting arms 34 may be fixedly mounted by any fixing means other than bolts (e.g. by welding).

Figure 4:
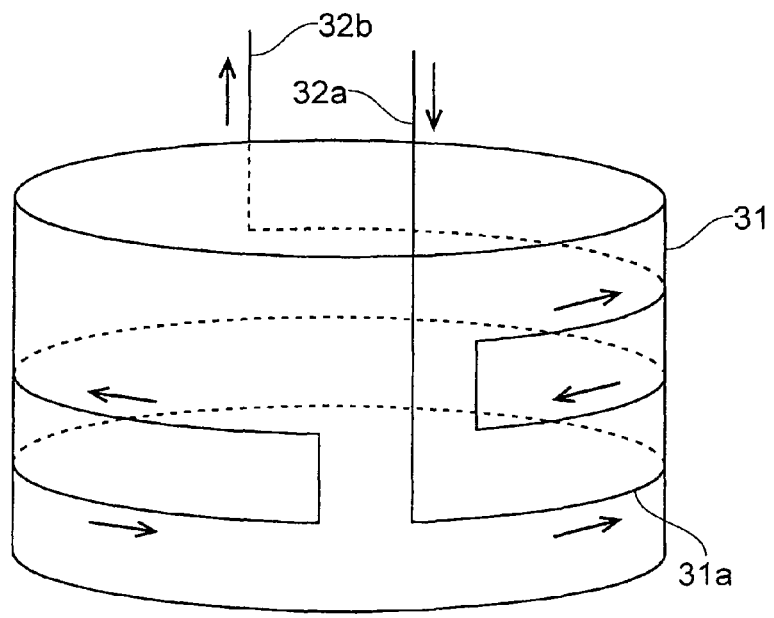
FIG. 4 is a schematic view of a configuration example of water channel in the water-cooling means.

FIG. 4 is a schematic view of a configuration example of the water channel inside the water-cooling means. As shown in FIG. 4, the water channel 31a provided inside the water-cooling means 31 leads the cooling water fed through the feed-water pipe 32a flow downward to the bottom of the water channel, and then directs the cooling water to flow gradually in a horizontal and vertical direction until the cooling water is discharged from the water-cooling means 31. In FIG. 4, the arrows indicate directions in which the cooling water flows. Flow directions of the cooling water after downward flow are not limited to the horizontal direction followed by the vertical one but may be any direction configuration to allow a gradual upward flow. For example, the water channel 31a may be constructed spirally so that the cooling water may flow upward with a swirling movement.

In the region of cooling water inflow into the water-cooling means 31, the cooling water is not so much heated by the radiant heat from the single crystal 22, resulting in a low temperature range, hence the likelihood of bubble generation is low. If any, the generated bubbles in the cooling water are readily carried away by horizontal or upward water flow. When the water channel 31a is configured as shown in FIG. 4, the cooling water flows downward only in the region of cooling water inflow into the water-cooling means 31 where the likelihood of bubble generation is low and, thereafter, the cooling water flows upward and the temperature thereof gradually rises due to heating by the radiant heat from the single crystal 22 to cause bubble generation; the bubbles are, however, promptly discharged through the water channel 31a from the waste pipe 32b with the upward and swirl flow of cooling water. Further, because the heated cooling water intumesces and produces buoyancy to some extent, and easily flow upward, bubbles are easily discharged also with this buoyancy.

Such water-cooling means 31 can be realized, for example, by preparing a cylindrical interior wall and a cylindrical exterior wall for constituting a double-wall structure, forming the water channel 31a on the outer circumferential surface of the interior wall, and then covering the outer circumferential surface of the interior wall with the exterior wall.

On the occasion of pulling the single crystal 22, an inert gas atmosphere is produced in the inside of the single crystal pulling apparatus 10. Argon gas (hereinafter referred to as "Ar gas") is used as the inert gas. Ar gas is fed into the chamber 11 through an inlet port 19a in the upper part of the chamber 11, flows down between the surface of the single crystal 22 and the heat-shielding member 17, passes over the surface of the melt 20 and is then guided to the outside of the crucible 13 and discharged through an discharge port 19b provided at the lower part of the chamber 11 and below the crucible 13.

In the present embodiment, the supporting arms 34 are disposed between the water piping 32 and the single crystal 22 so as to shield the water piping 32 on the single crystal side, so that even in the event of fall and collapse of the single crystal 22 due to breakage of the seed neck portion connected to the seed 21 or rupture of the single crystal 22 due to high thermal stress during pulling of the single crystal 22, the supporting arms 34 can prevent the water piping 32 from being damaged by the falling single crystal or by strewn pieces of the ruptured single crystal.

The damaged water piping 32 may possibly result in vapor explosion due to leakage of water into the inside of the chamber 11. However, the safety of the single crystal pulling apparatus 10 can be improved by disposing the supporting arms 34 between the water piping 32 and the single crystal 22.

Since each joint 32c of the copper-made segment of the water piping 32 and the stainless steel-made segment thereof is disposed outside the chamber 11, it is easy to find the potential water leakage in the joint 32c due to local corrosion resulting from the formation of an electric circuit in the presence of copper, stainless steel and cooling water as an conductor, and consequently the safety of the single crystal pulling apparatus 10 can be improved. The water-cooling means 31 and the water piping 32 that are accommodated inside the chamber 11 are both made of copper and, therefore, the joints 32d shown in FIG. 2 are free from the risk of troubles as being caused by jointing dissimilar metals.

Furthermore, the water channel 31a disposed within the water-cooling means 31 facilitates discharging potential bubbles to be generated in cooling water out of the water-cooling means 31 as mentioned hereinabove. Therefore, it is possible to reduce the risk of the boiling of cooling water due to the abovementioned positive feedback resulting from bubbles can be reduced, and it is possible to prevent the failure of the water-cooling means 31 due to boiled cooling water, and prevent damages of joints 32d between the water-cooling means 31 and the water piping 32 and, as a result, the safety of the single crystal pulling apparatus 10 can be improved.

The present invention is not limited to the embodiments as described hereinabove but various modifications can be made without departing the spirit of the present invention.

The single crystal pulling apparatus of the present invention can increase the pulling rate by cooling the crystal which is being pulled up by means of the water-cooling means, and further can prevent the water piping from being damaged in the event of fall and collapse of the single crystal due to the failure of the seed neck portion or in the event of the rupture of the single crystal due to thermal stress, for instance. And if the water piping has joints of dissimilar metals, the single crystal pulling apparatus of the present invention can prevent vapor explosion resulting from water leakage due to local corrosion at such joints. Furthermore, the single crystal pulling apparatus of the present invention can prevent accidents of the water-cooling means such as damages thereof resulting from the boiling of cooling water due to bubbles retaining in the water channel inside the water-cooling means. Because of these advantages, the single crystal pulling apparatus of the present invention can safely manufacture silicon single crystals. Therefore, the technology provided by the present invention is very useful for the single crystal pulling apparatus.

What is claimed is:

1. A single crystal pulling apparatus, comprising:
a chamber;
a crucible disposed within the chamber for containing a melt;
a water-cooling means within which a water channel is disposed, the water cooling means being disposed within the chamber in such a manner as surrounding a single crystal to be pulled up from the melt in the crucible;
water piping for feeding cooling water to and discharging the same from the water channel of the water-cooling means, the water piping extending above the chamber; and
supporting arms connected to the chamber for supporting the water-cooling means, wherein the supporting arms are disposed between the single crystal and the water piping so as to cover the water piping on the side facing the crystal and the supporting arms are fixedly mounted onto an inner surface of an upper part of the chamber and an upper part of the water-cooling means, wherein the water-cooling means is made of copper, wherein the water piping is extended to the outside of the chamber, and the water piping comprises a part made from copper as being connected to the water-cooling means and the other part made of stainless steel, the copper part and stainless steel part being jointed to each other outside the chamber.

2. The single crystal pulling apparatus as claimed in claim 1, wherein the supporting arms are formed using shape steels.

3. The single crystal pulling apparatus as claimed in claim 2, wherein the supporting arms are made of stainless steel.

4. The single crystal pulling apparatus as claimed in claim 3, wherein the water channel leads the cooling water fed from the water piping downward to the bottom of the water-cooling means and then leads the cooling water gradually upward with circulation flow for discharging the cooling water.

5. The single crystal pulling apparatus as claimed in claim 2, wherein the water channel leads the cooling water fed from the water piping downward to the bottom of the water-cooling means and then leads the cooling water gradually upward with circulation flow for discharging the cooling water.

6. The single crystal pulling apparatus as claimed in claim 1, wherein the supporting arms are made of stainless steel.

7. The single crystal pulling apparatus as claimed in claim 6, wherein the water channel leads the cooling water fed from the water piping downward to the bottom of the water-cooling means and then leads the cooling water gradually upward with circulation flow for discharging the cooling water.

8. The single crystal pulling apparatus as claimed in claim 1, wherein the jointed portion of the copper part and the stainless steel part is exposed.

9. The single crystal pulling apparatus as claimed in claim 8, wherein the water channel leads the cooling water fed from the water piping downward to the bottom of the water-cooling means and then leads the cooling water gradually upward with circulation flow for discharging the cooling water.

10. The single crystal pulling apparatus as claimed in claim 1, wherein the water channel leads the cooling water fed from the water piping downward to the bottom of the water-cooling means and then leads the cooling water gradually upward with circulation flow for discharging the cooling water.

11. The single crystal pulling apparatus as claimed in claim 1, wherein the water cooling means comprises a double wall structure that is constituted by a cylindrical interior wall and a cylindrical exterior wall, the water channel formed on an outer circumferential surface of the interior wall with the outer circumferential surface of the interior wall being covered with the exterior wall.

* * * * *